US012581820B2

(12) United States Patent
Xue et al.

(10) Patent No.: US 12,581,820 B2

(45) Date of Patent: Mar. 17, 2026

(54) DISPLAY SUBSTRATE, MANUFACTURING METHOD AND DISPLAY DEVICE HAVING DISPLAY UNITS ON CONNECTED ISLANDS

(71) Applicant: BOE TECHNOLOGY GROUP CO., LTD., Beijing (CN)

(72) Inventors: Jinxiang Xue, Beijing (CN); Fang Liu, Beijing (CN); Zhongyuan Sun, Beijing (CN); Wenqi Liu, Beijing (CN); Jingkai Ni, Beijing (CN); Che An, Beijing (CN); Lu Wang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 495 days.

(21) Appl. No.: 18/246,658

(22) PCT Filed: Apr. 29, 2022

(86) PCT No.: PCT/CN2022/090680

§ 371 (c)(1),
(2) Date: Mar. 24, 2023

(87) PCT Pub. No.: WO2023/206537

PCT Pub. Date: Nov. 2, 2023

(65) Prior Publication Data

US 2025/0072233 A1 Feb. 27, 2025

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC ......................... H10K 59/131; H10K 59/1201
See application file for complete search history.

(56) References Cited

U.S. PATENT DOCUMENTS

| | | | | |
|---|---|---|---|---|
| 2017/0294610 A1* | 10/2017 | Sasaki | .................. | H10K 59/131 |
| 2018/0046221 A1 | 2/2018 | Choi et al. | | |
| 2019/0198782 A1* | 6/2019 | Kim | ..................... | H10K 59/131 |
| 2019/0280077 A1* | 9/2019 | Park | ..................... | H10K 77/111 |

(Continued)

FOREIGN PATENT DOCUMENTS

| | | |
|---|---|---|
| CN | 111799399 A | 10/2020 |
| CN | 112103319 A | 12/2020 |

(Continued)

*Primary Examiner* — Lex H Malsawma

(74) *Attorney, Agent, or Firm* — McCoy Russell LLP

(57) ABSTRACT

The present disclosure provides a display substrate, a manufacturing method thereof and a display device. The display substrate includes a base substrate, including a hollowed-out region, an island and a connection bridge; a plurality of display units; and a source/drain metal pattern, including patterns of a plurality of signal lines. On the island, a plurality of inorganic film layers is arranged between the base substrate and the source/drain metal pattern, and the plurality of inorganic film layers includes a first inorganic film layer arranged at a side furthest away from the base substrate. On the connection bridge, at least one first organic film layer is arranged between the base substrate and the source/drain metal pattern.

20 Claims, 11 Drawing Sheets

(56) References Cited

U.S. PATENT DOCUMENTS

| | | | |
|---|---|---|---|
| 2020/0051964 A1 | 2/2020 | Jung et al. | |
| 2020/0388666 A1* | 12/2020 | Park | H10D 86/60 |
| 2020/0409419 A1* | 12/2020 | He | G06F 1/189 |
| 2021/0225961 A1 | 7/2021 | Sun et al. | |
| 2022/0093896 A1 | 3/2022 | Xue et al. | |

FOREIGN PATENT DOCUMENTS

| | | |
|---|---|---|
| CN | 113689788 A | 11/2021 |
| CN | 113724590 A | 11/2021 |
| CN | 113778261 A | 12/2021 |
| IN | 110289292 A | 9/2019 |
| KR | 101810050 B1 | 12/2017 |

* cited by examiner

DISPLAY SUBSTRATE, MANUFACTURING METHOD AND DISPLAY DEVICE HAVING DISPLAY UNITS ON CONNECTED ISLANDS

CROSS REFERENCE TO RELATED APPLICATION

This application is the U.S. national phase of PCT Application No. PCT/CN2022/090680 filed on Apr. 29, 2022, the entire contents of which are hereby incorporated by reference.

TECHNICAL FIELD

The present disclosure relates to the field of display technology, in particular to a display substrate, a manufacturing method thereof and a display device.

BACKGROUND

In the related art, a stretchable flexible display device becomes a development trend of the display technology. Each substrate and circuitry layer in the display device, especially an inorganic layer, is flexible, but the flexibility is limited. If the display device is stretched directly, the inorganic layer, an organic layer, a substrate and circuitries in the display device may be broken or be deformed irreversibly. Therefore, in the related art, a hollowed-out region is arranged in a base substrate and in the film layers above the base substrate, and a display substrate includes a plurality of islands arranged in an array form and separated from each other and a plurality of connection bridges for coupling the islands to each other. A strain generated during the stretching is released through the hollowed-out region in the base substrate so as to improve the stretchability of the display substrate. A display unit is arranged on the island, and a signal line is arranged on the connection bridge. However, the stress and strain are mainly concentrated on the connection bridge during the stretching, so there is an urgent need to prevent the signal lines on the connection bridge from being broken during the stretching.

SUMMARY

An object of the present disclosure is to provide a display substrate, a manufacturing method thereof and a display device, so as to prevent the signal lines on the connection bridge from being broken.

The present disclosure provides the following technical solutions.

In one aspect, the present disclosure provides in some embodiments a display substrate, including: a base substrate, including a hollowed-out region, a plurality of islands arranged in an array form and separated from each other and a plurality of connection bridges for coupling the islands to each other; a plurality of display units arranged in an array form, each island being provided with at least one of the display units; and a connection unit through which the display units are electrically coupled to each other, the connection unit including a plurality of signal lines, a part of each signal line being arranged on the connection bridge, and the other part of the signal line extending to the island to be electrically coupled to the display unit. A source/drain metal pattern is arranged on the base substrate and includes patterns of the plurality of signal lines. On the island, a plurality of inorganic film layers is arranged between the base substrate and the source/drain metal pattern, and the plurality of inorganic film layers includes a first inorganic film layer arranged at a side furthest away from the base substrate. On the connection bridge, at least one first organic film layer is arranged between the base substrate and the source/drain metal pattern, an orthogonal projection of the first organic film layer onto the base substrate coincides with an orthogonal projection of the connection bridge onto the base substrate, an orthogonal projection of a part of the first organic film layer onto the base substrate partially overlaps with an orthogonal projection of the island onto the base substrate to form an lapping region at a position where the connection bridge is coupled to the island, and a surface of the first organic film layer away from the base substrate is flush with a surface of the first inorganic film layer away from the base substrate, or a segment difference between the surface of the first organic film layer away from the base substrate and the surface of the first inorganic film layer away from the base substrate is less than a predetermined threshold.

In a possible embodiment of the present disclosure, the orthogonal projection of the first organic film layer onto the base substrate does not coincide with an orthogonal projection of the hollowed-out region onto the base substrate, and the orthogonal projection of the first organic film layer onto the base substrate does not coincide with the orthogonal projection of the island onto the base substrate at a position where the connection bridge is not coupled to the island.

In a possible embodiment of the present disclosure, the lapping region covers a side surface of the first inorganic film layer away from the base substrate.

In a possible embodiment of the present disclosure, a width d of the lapping region is greater than 0 and less than or equal to 2 μm.

In a possible embodiment of the present disclosure, the lapping region is inclined from the connection bridge to the island.

In a possible embodiment of the present disclosure, a pattern of the orthogonal projection of the island onto the base substrate includes a first boundary line at the position where the connection bridge is coupled to the island, and an orthogonal projection of the lapping region onto the base substrate extends along the first boundary line.

In a possible embodiment of the present disclosure, the orthogonal projection of the lapping region onto the base substrate is of an arc-like or right-angled shape.

In a possible embodiment of the present disclosure, the connection bridge is further provided with a second organic film layer arranged at a side of the source/drain metal pattern away from the base substrate, and an orthogonal projection of the second organic film layer onto the base substrate coincides with the orthogonal projection of the first organic film layer onto the base substrate.

In a possible embodiment of the present disclosure, the base substrate is further provided with a source/drain metal covering pattern, and the source/drain metal covering pattern includes a first pattern arranged on the island and a second pattern arranged on the connection bridge; the first pattern covers a side of the source/drain metal pattern away from the base substrate, and an orthogonal projection of the first pattern onto the base substrate surrounds an orthogonal projection of the display unit onto the base substrate; and the second pattern covers a side of the second organic film layer away from the base substrate, and an orthogonal projection of the second pattern onto the base substrate coincides with the orthogonal projection of the second organic film layer onto the base substrate.

In a possible embodiment of the present disclosure, at the position where the connection bridge is coupled to the island, the orthogonal projection of the first pattern onto the base substrate includes a first lapping pattern, and the first lapping pattern coincides with the orthogonal projection of the lapping region onto the base substrate, or the orthogonal projection of the first pattern onto the base substrate does not coincide with the orthogonal projection of the lapping region onto the base substrate.

In a possible embodiment of the present disclosure, the first pattern is provided with at least one groove surrounding the display unit at a side away from the base substrate.

In a possible embodiment of the present disclosure, the display unit includes a first electrode, a second electrode arranged at a side of the first electrode away from the base substrate and a light-emitting layer arranged between the first electrode and the second electrode, the base substrate is further provided with a pixel definition layer for defining a plurality of pixel apertures, and the first electrode and the light-emitting layer are arranged in the pixel apertures. The base substrate is further provided with an electrode covering layer arranged between the first electrode and the second electrode, an pattern of the electrode covering layer includes a third pattern arranged on the island and a fourth pattern arranged on the connection bridge, the third pattern at least includes an aperture pattern coinciding with the pixel aperture, and an orthogonal projection of the fourth pattern onto the base substrate coincides with the orthogonal projection of the second pattern onto the base substrate.

In a possible embodiment of the present disclosure, at the position where the connection bridge is coupled to the island, an orthogonal projection of the third pattern onto the base substrate includes a second lapping pattern, and the second lapping pattern completely coincides with the orthogonal projection of the lapping region onto the base substrate; or at the position where the connection bridge is coupled to the island, the orthogonal projection of the third pattern onto the base substrate does not coincide with the orthogonal projection of the lapping region onto the base substrate.

In a possible embodiment of the present disclosure, the display substrate further includes a packaging layer, and the packaging layer covers a side of the display unit and a side of the connection unit away from the base substrate in a shape-following manner.

In a possible embodiment of the present disclosure, the plurality of inorganic film layers includes an isolation layer, a buffer layer, a gate insulation layer and an interlayer dielectric layer arranged sequentially from a side close to the base substrate to a side away from the base substrate, and the first inorganic film layer is the interlayer dielectric layer.

In another aspect, the present disclosure provides in some embodiments a display device, including the above-mentioned display substrate.

In yet another aspect, the present disclosure provides in some embodiments a method for manufacturing the above-mentioned display substrate, including: providing a base substrate, the base substrate including a hollowed-out region, a plurality of islands arranged in an array form and separated from each other and a plurality of connection bridges for coupling the islands to each other; and forming a plurality of display units and a connection unit through which the display units are electrically coupled to each other on the base substrate, each island being provided with at least one of the display units, the connection unit including a plurality of signal lines, a part of each signal line being arranged on the connection bridge, and the other part of the signal line extending to the island to be electrically coupled to the display unit. A source/drain metal pattern is arranged on the base substrate and includes patterns of the plurality of signal lines. On the island, a plurality of inorganic film layers is arranged between the base substrate and the source/drain metal pattern, and the plurality of inorganic film layers includes a first inorganic film layer arranged at a side furthest away from the base substrate. On the connection bridge, at least one first organic film layer is arranged between the base substrate and the source/drain metal pattern, an orthogonal projection of the first organic film layer onto the base substrate coincides with an orthogonal projection of the connection bridge onto the base substrate, an orthogonal projection of a part of the first organic film layer onto the base substrate partially overlaps with an orthogonal projection of the island onto the base substrate to form an lapping region at a position where the connection bridge is coupled to the island, and a surface of the first organic film layer away from the base substrate is flush with a surface of the first inorganic film layer away from the base substrate, or a segment difference between the surface of the first organic film layer away from the base substrate and the surface of the first inorganic film layer away from the base substrate is less than a predetermined threshold.

In a possible embodiment of the present disclosure, the forming the plurality of display units and the connection unit through which the display units are electrically coupled to each other on the base substrate includes: depositing the plurality of inorganic film layers on the base substrate, removing the plurality of inorganic film layers on the connection bridges, and reserving the plurality of inorganic film layers on the islands. The plurality of inorganic film layers includes the first inorganic film layer arranged at a side furthest away from the base substrate.

In a possible embodiment of the present disclosure, subsequent to depositing the plurality of inorganic film layers on the base substrate, removing the plurality of inorganic film layers on the connection bridges and reserving the plurality of inorganic film layers on the islands, the method further includes: forming a first organic material layer covering the entire base substrate at a side of the first inorganic film layer away from the base substrate; and patterning the first organic material layer to form a first organic pattern, the first organic pattern including a first reserved region and a first aperture region, and the first aperture region at least including a region corresponding to each display unit.

In a possible embodiment of the present disclosure, subsequent to patterning the first organic material layer to form the first organic pattern, the method further includes: forming a source/drain metal layer at a side of the first inorganic film layer away from the base substrate; and patterning the source/drain metal layer to form the source/drain metal pattern.

In a possible embodiment of the present disclosure, subsequent to patterning the source/drain metal layer to form the source/drain metal pattern, the method further includes etching the first organic material layer corresponding to the hollowed-out region to form the first organic film layer.

In a possible embodiment of the present disclosure, the first reserved region includes a pattern of the lapping region.

The present disclosure has the following beneficial effects.

According to the embodiments of the present disclosure, the base substrate of the display substrate includes the islands, the connection bridges and the hollowed-out region. On each island, the plurality of inorganic film layers is arranged between the signal line and the base substrate. On each connection bridge, the inorganic film layers between the signal line and the base substrate are removed. The first organic film layer is arranged between the signal line and the base substrate, and a surface of the first organic film layer away from the base substrate is flush with a surface of the first inorganic film layer away from the base substrate, or the segment difference between the surface of the first organic film layer away from the base substrate and the surface of the first inorganic film layer away from the base substrate is less than the predetermined threshold. A step between the plurality of inorganic film layers on the island and the connection bridge on the base substrate is filled with the first organic film layer, so that the signal line extends from the connection bridge into the island at a same level. As a result, it is able to increase the stress and strain performance of the display substrate when no organic film layer is arranged on the connection bridge, and prevent the signal lines from being easily broken due to the step between the inorganic film layer and the base substrate.

DETAILED DESCRIPTION

Figure 1:
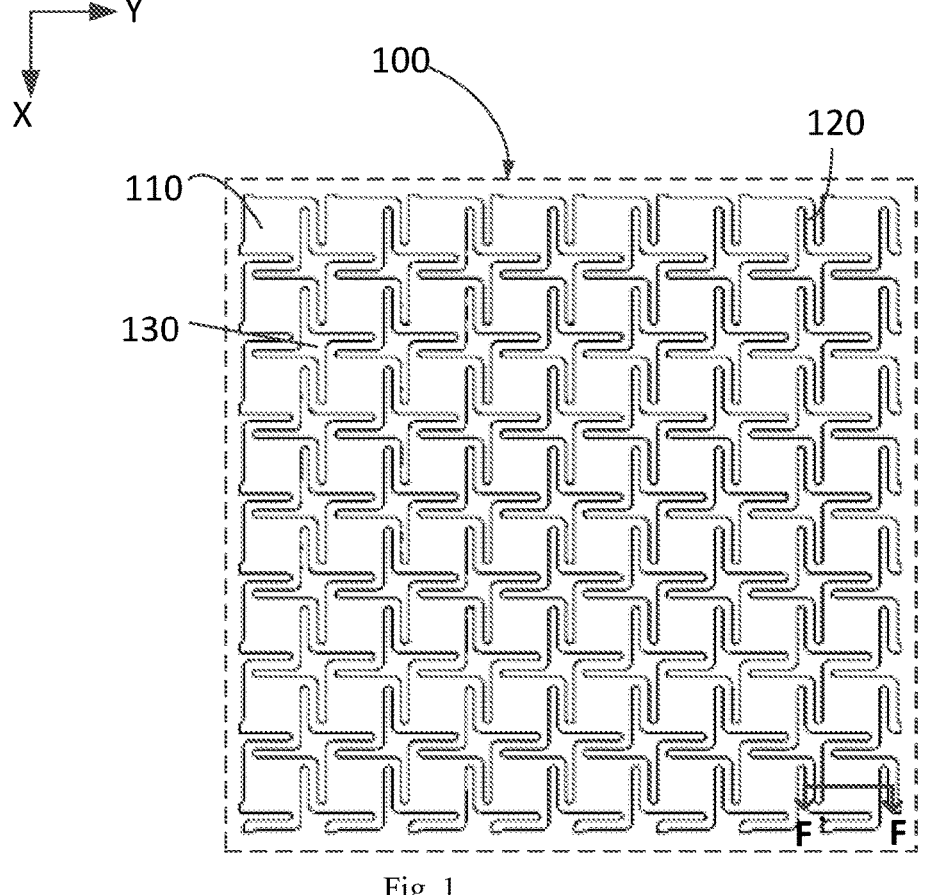
FIG. 1 is a partial front view of a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The following description will be given at first.

In a conventional stretchable display substrate, a hollowed-out region is arranged in a base substrate and in film layers above the base substrate, so that the display substrate includes a plurality of islands arranged in an array form and separated from each other and a plurality of connection bridges for coupling the islands to each other. A strain generated during the stretching is released through the hollowed-out region in the base substrate, so as to achieve the stretchability of the display substrate. A display unit is arranged on the island, a signal line is arranged on the connection bridge, and the signal line extends into the island and is coupled to the display unit to achieve the display driving. The stress and strain are mainly concentrated on the connection bridge during the stretching, and in order to increase a tensile stress of the connection bridge, in the related art, an inorganic film layer between the signal line on the connection bridge and the base substrate is etched off, and the signal line is deposited on the base substrate directly. However, the inorganic layer is etched off on the connection bridge and reserved on the island, so a large step is formed. The signal line needs to pass through the step when extending into the display unit, so it is easily broken at the step or the impedance is increased due to a decrease in a thickness of the film. In this regard, there is an urgent need to prevent the signal line from being broken during the stretching.

Figure 2:
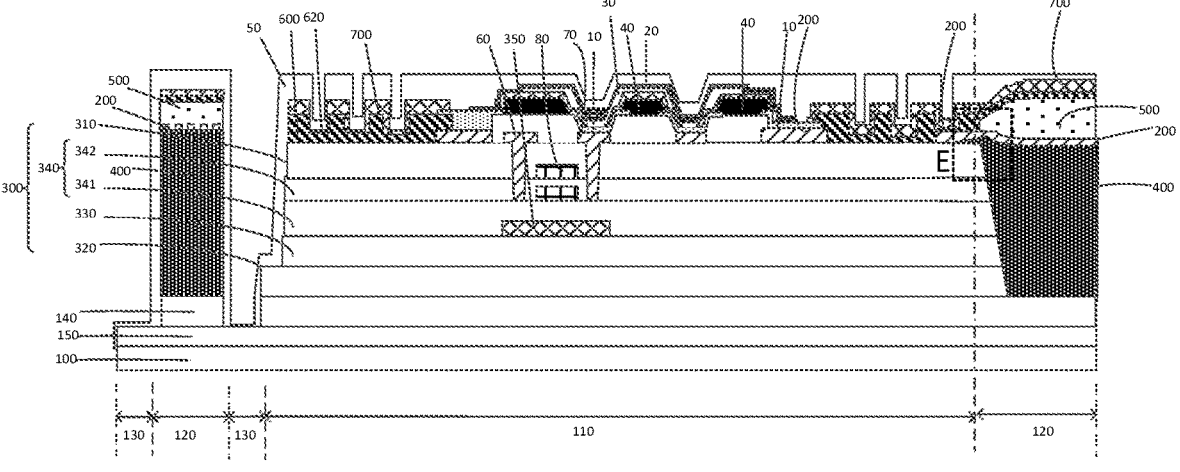
FIG. 2 is a sectional view of the display substrate along line F-F' in FIG. 1.
Figure 3:
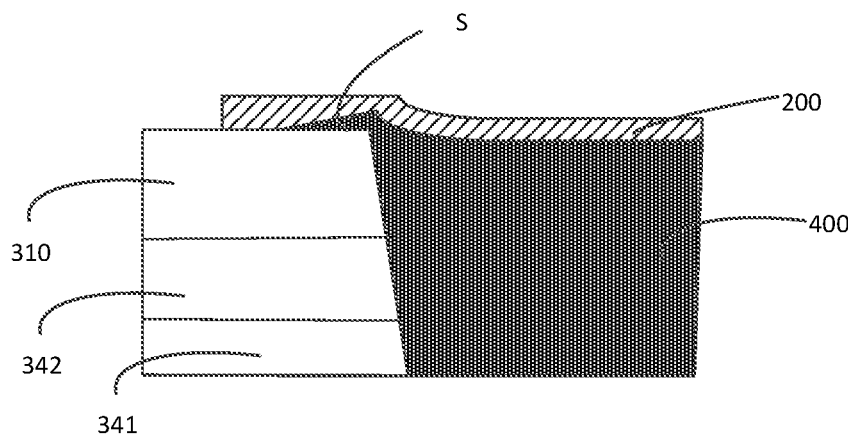
FIG. 3 is an enlarged view of E in FIG. 2.

As shown in FIG. 1 to FIG. 3, the present disclosure provides in some embodiments a display substrate, which includes: a base substrate, including a hollowed-out region 130, a plurality of islands 110 arranged in an array form and separated from each other and a plurality of connection bridges 120 for coupling the islands 110 to each other; a plurality of display units arranged in an array form, and each island 110 being provided with at least one of the display units; and a connection unit through which the display units are electrically coupled to each other, the connection unit including a plurality of signal lines 200, one part of each signal line 200 being arranged on the connection bridge 120, and the other part of the signal line extending to the island 110 and being electrically coupled to the display unit. A source/drain metal pattern is arranged on the base substrate 100 and includes patterns of the plurality of signal lines 200. On the island 110, a plurality of inorganic film layers 300 is arranged between the base substrate 100 and the source/drain metal pattern, and the plurality of inorganic film layers 300 includes a first inorganic film layer 310 arranged at a side furthest away from the base substrate 100. On the connection bridge 120, at least one first organic film layer 400 is arranged between the base substrate 100 and the source/drain metal pattern, an orthogonal projection of the first organic film layer 400 onto the base substrate 100 coincides with an orthogonal projection of the connection bridge 120 onto the base substrate 100, an orthogonal projection of a part of the first organic film layer 400 onto the base substrate partially overlaps with an orthogonal projection of the island 110 onto the base substrate 100 to form an lapping region S at a position where the connection bridge 120 is coupled to the island 110, and a surface of the first organic film layer 400 away from the base substrate 100 is flush with a surface of the first inorganic film layer 310 away from the base substrate 100, or a segment difference between the surface of the first organic film layer 400 away from the base substrate 100 and the surface of the first inorganic film layer 310 away from the base substrate 100 is less than a predetermined threshold.

It should be appreciated that, when the surface of the first organic film layer 400 away from the base substrate 100 is flush with the surface of the first inorganic film layer 310 away from the base substrate 100 or the segment difference is less than the predetermined threshold, it means that, as shown in FIG. 2 and FIG. 3, the surface of the first organic film layer 400 away from the base substrate 100 includes a surface of the lapping region and a surface of a region other than the lapping region, the surface of the region other than the lapping region of the first organic film layer 400 is substantially flush with the surface of the first inorganic film layer 310 away from the base substrate 100. The smaller the segment difference, the better. The predetermined threshold may be an allowable error range in the process.

According to the embodiments of the present disclosure, the base substrate 100 of the display substrate includes the islands 110, the connection bridges 120 and the hollowed-out region 130. On the island 110, the plurality of inorganic film layers 300 is arranged between the signal line 200 and the base substrate 100. On the connection bridge 120, the inorganic film layer 300 between the signal line 200 and the base substrate 100 is removed. The first organic film layer 400 is arranged between the signal line 200 and the base substrate 100, and the surface of the first organic film layer 400 away from the base substrate 100 is flush with the surface of the first inorganic film layer 310 away from the base substrate 100, or the segment difference is less than the predetermined threshold. A step between the plurality of inorganic film layers 300 on the island 110 and the connection bridge 120 on the base substrate 100 is filled with the first organic film layer 400, so that the signal line 200 extends from the connection bridge 120 into the island 110 at a same level. As a result, it is able to increase the stress and strain performance of the display substrate when no organic film layer is arranged on the connection bridge 120, and prevent the signal lines from being easily broken due to the step between the inorganic film layer and the base substrate 100.

In the embodiments of the present disclosure, the orthogonal projection of the first organic film layer 400 onto the base substrate 100 does not coincide with an orthogonal projection of the hollowed-out region 130 onto the base substrate 100. The orthogonal projection of the part of the first organic film layer 400 onto the base substrate 100 partially overlaps with the orthogonal projection of the island 110 onto the base substrate 100 to form the lapping region S at the position where the connection bridge 120 is coupled to the island 110. The orthogonal projection of the first organic film layer 400 onto the base substrate 100 does not coincide with the orthogonal projection of the island 110 onto the base substrate 100 at a position where the connection bridge is not coupled to the island 110.

In other words, the pattern of the first organic film layer 400 is substantially the same as the pattern of the connection bridge 120, and it is partially lapped onto the island 110 at a position where the connection bridge 120 is coupled to the island 110, but not lapped onto the island 110 at a position where the connection bridge 120 is not coupled to the island 110. In this regard, it is able to ensure the packaging reliability. In addition, the first organic film layer 400 is not arranged in the hollowed-out region 130, so as to ensure the stretchability of the display substrate.

In some embodiments of the present disclosure, as shown in FIG. 2 and FIG. 3, the lapping region S covers a side surface of the first inorganic film layer 310 away from the base substrate 100. That is, as shown in FIG. 2, the lapping region S is lapped onto an upper side surface of the first inorganic film layer 310.

In addition, in some embodiments of the present disclosure, a width d of the lapping region is greater than 0 and less than or equal to 2 μm. In this regard, the first organic film layer 400 is lapped onto the inorganic film layer on the island 110, so as to enable the signal line 200 to extend into the display unit at a same level, prevent the normal display at the display region from being adversely affected due to the lapping region S, and meet the requirement on the process accuracy. It should be appreciated that, in the embodiments of the present disclosure, the size of the lapping region S is not limited thereto.

In addition, in some embodiments of the present disclosure, as shown in FIG. 3, the lapping region S is inclined from the connection bridge 120 to the island 110. The first organic film layer 400 is formed through patterning, e.g., exposure, development and etching. Due to the limitation of the etching process, in order to enable the signal line 200 to extend smoothly through a junction between the lapping region S and the first inorganic film layer 310, the lapping region S is inclined.

Figure 24:
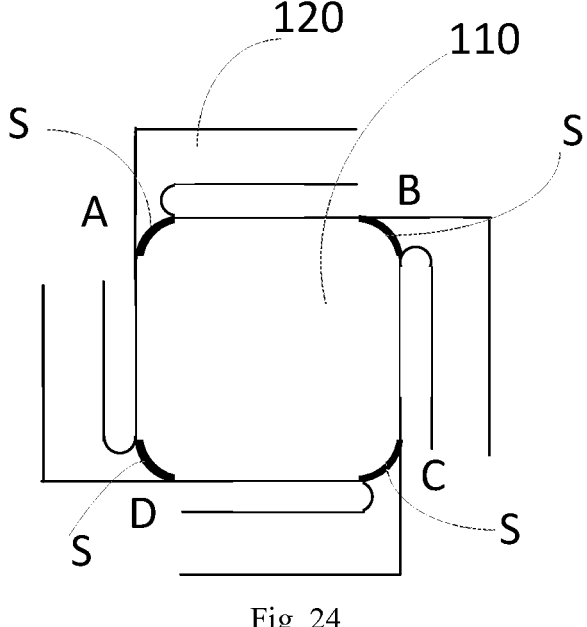
FIG. 24 is a schematic view showing lapping positions where the first organic film layer is lapped onto the island in the display substrate according to one embodiment of the present disclosure.

In addition, in some embodiments of the present disclosure, as shown in FIG. 24, a pattern of the orthogonal projection of the island 110 onto the base substrate 100 includes a first boundary line at the position where the connection bridge 120 is coupled to the island 110. The lapping region S is merely lapped onto a boundary line between the island 110 and the connection bridge 120, i.e., the first boundary line, so an orthogonal projection of the lapping region S onto the base substrate 100 extends along the first boundary line. For example, the lapping region is of an arc-like or right-angled shape or any other suitable shape.

It should be appreciated that, in some embodiments of the present disclosure, the display unit includes a thin film transistor and a light-emitting element. The light-emitting element includes a first electrode electrically coupled to the thin film transistor, a second electrode arranged at a side of the first electrode away from the base substrate 100 and a light-emitting layer arranged between the first electrode and the second electrode. The thin film transistor includes a source electrode 60, a drain electrode 70 and a gate electrode 80. The source/drain metal pattern includes the source electrode and the drain electrode of the thin film transistor and the patterns of the plurality of signal lines 200. In the embodiments of the present disclosure, the signal line 200, the source electrode and the drain electrode of the thin film transistor are formed through a same patterning process. It should be appreciated that, in actual use, the signal line 200 may also be formed through patterning a metal layer different from the source electrode and the drain electrode of the thin film transistor.

It should be appreciated that, in FIG. 2, the display substrate includes a single-layer thin film transistor, i.e., the source/drain metal pattern is formed merely at one layer, and the signal line 200 is arranged at a same layer and made of a same material as the source electrode and the drain electrode of the thin film transistor. In some other embodiments of the present disclosure, the display substrate may include a double-layer thin film transistor, i.e., the source/drain metal pattern may be formed at at least two layers, and the signal line 200 may be arranged on any one layer of the source/drain metal pattern. The signal line 200 needs to be lapped onto the second electrode, so the signal line 200 is formed through the source/drain metal pattern at a side closest to the second electrode. For example, the display substrate includes two layers of source/drain metal pattern, and the two layers of source/drain metal pattern include a first source/drain metal pattern arranged at a side closest to the second electrode and a second source/drain metal pattern arranged at a side closest to the base substrate 100. The signal line 200 needs to be lapped onto the second electrode, so the signal line 200 is formed through the first source/drain metal pattern at a side closest to the second electrode, and patterns of the source electrode and the drain electrode of the thin film transistor are formed through the second source/drain metal pattern at a side closest to the base substrate.

In addition, in some embodiments of the present disclosure, as shown in FIG. 2, the connection bridge 120 is further provided with a second organic film layer 500 arranged at a side of the source/drain metal pattern away from the base substrate 100, and an orthogonal projection of the second organic film layer 500 onto the base substrate 100 coincides with the orthogonal projection of the first organic film layer 400 onto the base substrate 100. That is, a pattern of the second organic film layer 500 is substantially the same as a pattern of the first organic film layer 400.

In addition, in some embodiments of the present disclosure, as shown in FIG. 2, the base substrate 100 is further provided with a source/drain metal covering pattern 600 (SD cover), and the source/drain metal covering pattern 600 includes a first pattern arranged on the island 110 and a second pattern arranged on the connection bridge 120. The first pattern covers a side of the source/drain metal pattern away from the base substrate 100, and an orthogonal projection of the first pattern onto the base substrate 100 surrounds an orthogonal projection of the display unit onto the base substrate 100. The second pattern covers a side of the second organic film layer 500 away from the base substrate 100, and an orthogonal projection of the second pattern onto the base substrate 100 coincides with the orthogonal projection of the second organic film layer 500 onto the base substrate 100.

Based on the above, the source/drain metal covering pattern 600 mainly severs as a mask (for covering and shielding) when patterning the first organic film layer 400, so as to prevent the source/drain metal pattern and the inorganic film layer under the source/drain metal covering pattern 600 from being etched.

Figures 16, 17:
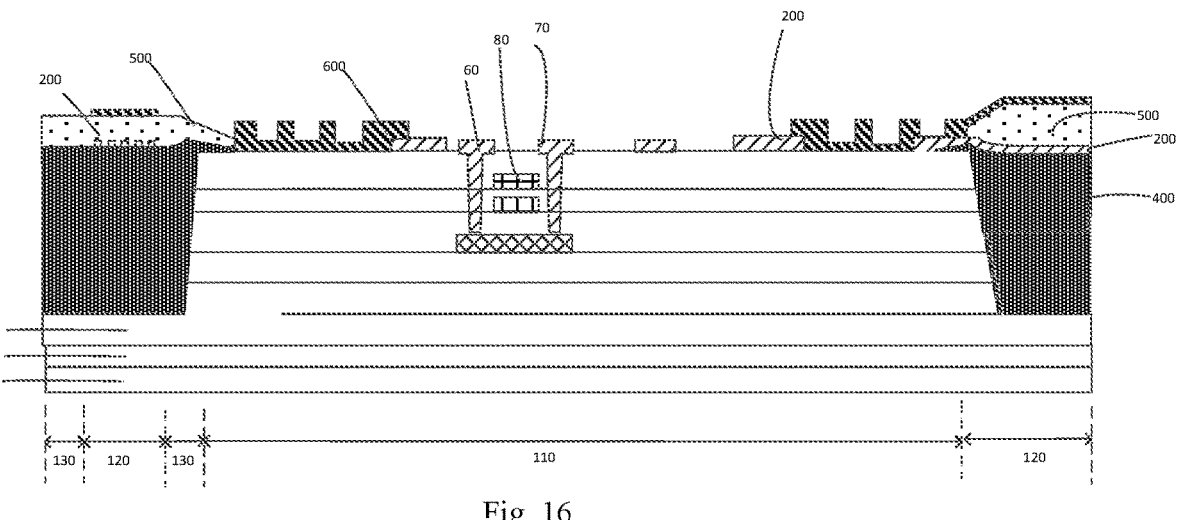
FIG. 16 is a schematic view showing S027 according to one embodiment of the present disclosure.
FIG. 17 is a top view of the display substrate in FIG. 16.

In some embodiments of the present disclosure, as shown in FIG. 2 and FIG. 17, at the position where the connection bridge 120 is coupled to the island 110, the orthogonal projection of the first pattern onto the base substrate 100 includes a first lapping pattern S1, and the first lapping pattern S1 coincides with the orthogonal projection of the lapping region S onto the base substrate 100.

Figure 12:
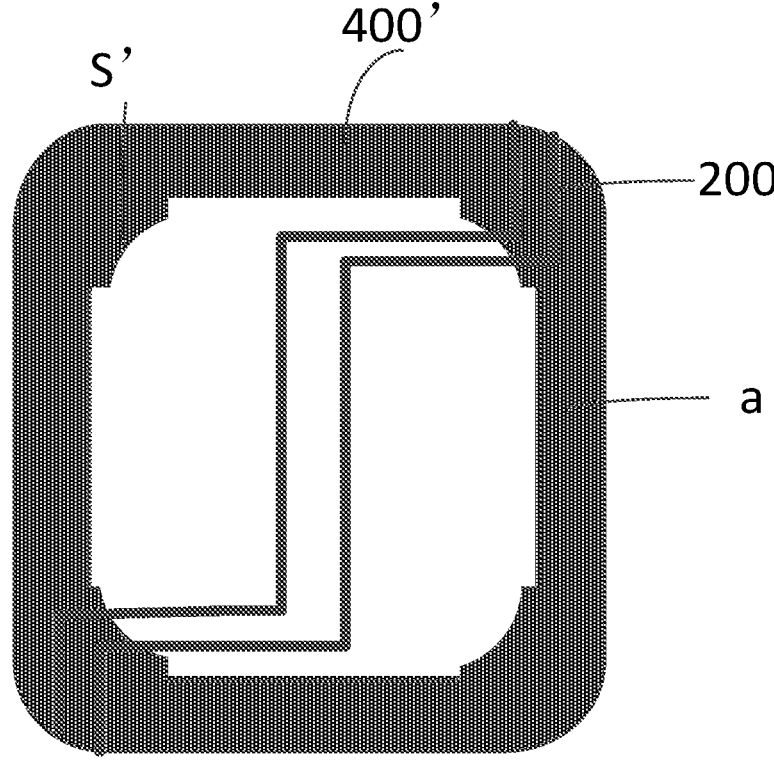
FIG. 12 is a top view of the display substrate in FIG. 11.

Based on the above, the first pattern includes the first lapping pattern S1 coinciding with the pattern of lapping region S. When patterning the first organic film layer 400, the first lapping pattern S1 on the first pattern serves as a mask. Hence, when the first organic film layer 400 is patterned, the first organic film layer 400 is reserved at the position where the connection bridge 120 is coupled to the island 110, so as to form the lapping region S. For example, as shown in FIG. 12, FIG. 17 and FIG. 24, the island 110 is coupled to the connection bridge 120 at four positions A, B, C and D, i.e., the island 110 has the lapping regions S at the four positions A, B, C and D. The first pattern surrounds the display unit, and the first lapping patterns S1 are formed at the four positions A, B, C and D, so as to form the lapping regions S at the four positions A, B, C and D when the first organic film layer 400 is patterned.

In some other embodiments of the present disclosure, at the position where the connection bridge 120 is coupled to the island 110, the orthogonal projection of the first pattern onto the base substrate 100 does not coincide with the orthogonal projection of the lapping region S onto the base substrate 100.

Based on the above, the first pattern may not be provided with the first lapping pattern S1 coinciding with the lapping region S. In this regard, it is able to pattern the first organic film layer 400 through an additional mask, thereby to enable the first organic film layer 400 to include the lapping region S.

Figure 15:
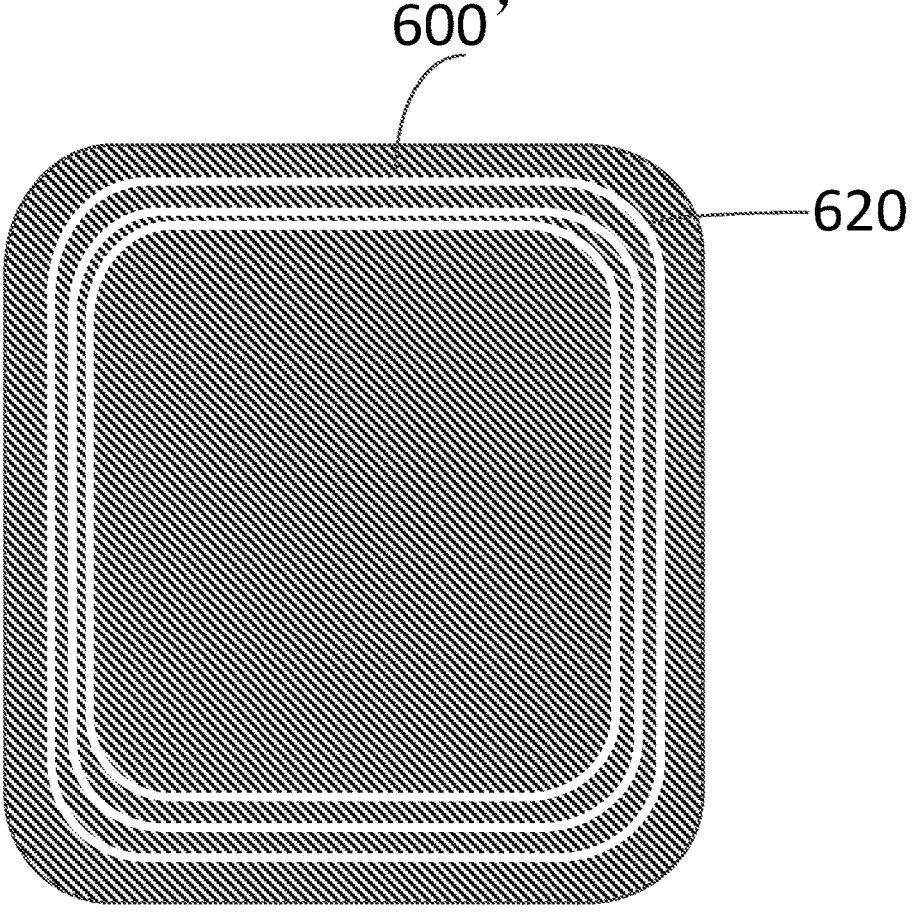
FIG. 15 is a top view of the display substrate in FIG. 14.

In addition, in some embodiments of the present disclosure, as shown in FIG. 2 and FIG. 15, the first pattern in the source/drain metal covering pattern 600 is provided with at least one groove 620 surrounding the display unit at a side away from the base substrate 100.

Based on the above, the source/drain metal covering pattern 600 is arranged outside the display unit and the pattern of the groove 620 surrounds the display unit, so as to increase a water and oxygen erosion path. In addition, the source/drain metal covering pattern 600 is made of an inorganic material. A thickness of the second pattern is less than or equal to a thickness of the first pattern, so as to reduce a thickness of the inorganic layer above the signal line 200, thereby to improve the elasticity of the connection bridge 120. The thickness of the second pattern is about 0 Å to 2000 Å.

The source/drain metal covering pattern 600 is an insulation layer made of one or more of an inorganic semiconductor material (amorphous silicon and polysilicon), an organic semiconductor material or an oxide-containing semiconductor material (such as zinc (Zn), indium (In), and gallium (Ga)).

In addition, in some embodiments of the present disclosure, as shown in FIG. 2, the light-emitting element includes a first electrode 10, a second electrode 20 arranged at a side of the first electrode 10 away from the base substrate 100 and a light-emitting layer 30 arranged between the first electrode 10 and the second electrode 20. The base substrate 100 is further provided with a pixel definition layer 40 for defining a plurality of pixel apertures, and the first electrode 10 and the light-emitting layer 30 are arranged in the pixel apertures. The base substrate 100 is further provided with an electrode covering layer 700 (AND cover) arranged between the first electrode 10 and the second electrode 20, an pattern of the electrode covering layer 700 includes a third pattern arranged on the island 110 and a fourth pattern arranged on the connection bridge 120, the third pattern at least includes an aperture pattern coinciding with the pixel aperture, and an orthogonal projection of the fourth pattern onto the base substrate 100 coincides with the orthogonal projection of the second pattern onto the base substrate 100.

Based on the above, when patterning the first organic film layer 400, the second organic film layer 500 and the inorganic film layer in the hollowed-out region 130, the third pattern of the electrode covering layer 700 serves as a mask. When patterning the first organic film layer 400 and the second organic film layer 500, the first electrode 10 layer is protected from being etched. In addition, the third pattern further includes the aperture pattern coinciding with the pixel aperture, and the light-emitting layer 30 and the second electrode 20 are formed in the aperture pattern, so as to form the light-emitting element.

Figure 23:
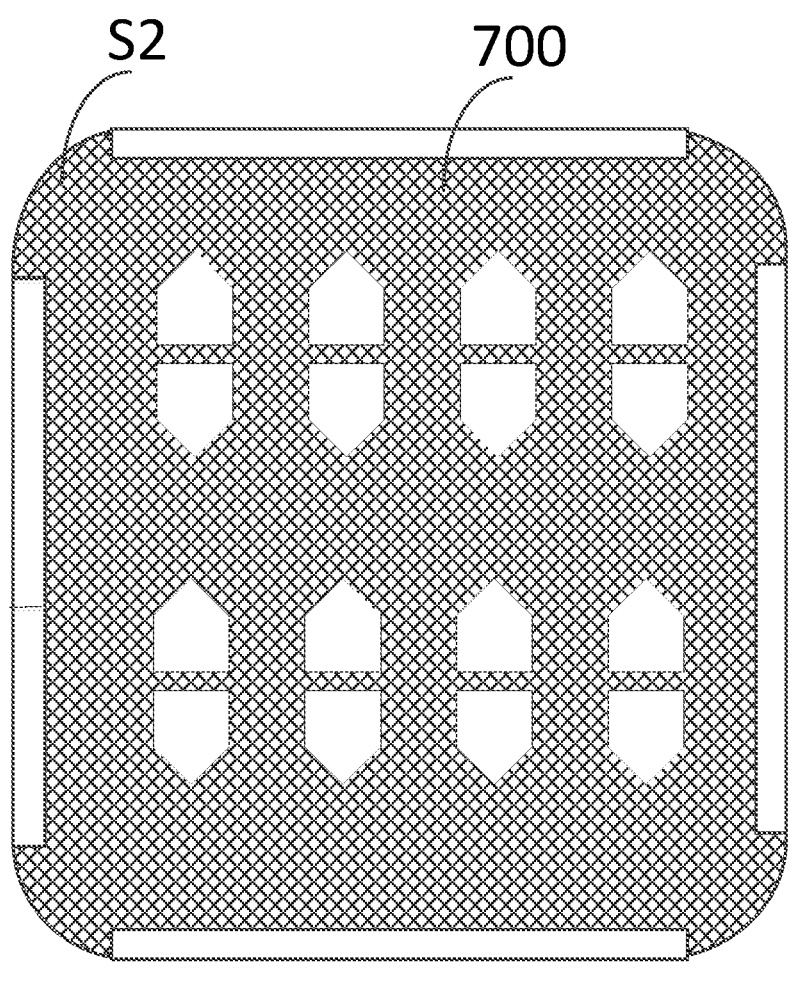
FIG. 23 is a top view of the display substrate in FIG. 22.

In addition, for example, as shown in FIG. 23, at the position where the connection bridge 120 is coupled to the island 110, an orthogonal projection of the third pattern onto the base substrate 100 includes a second lapping pattern S2, and the second lapping pattern S2 completely coincides with the orthogonal projection of the lapping region S onto the base substrate 100. Based on the above, the third pattern includes the second lapping pattern S2 coinciding with the pattern of lapping region S. When patterning the first organic film layer 400, the second lapping pattern S2 on the third pattern serves as a mask. When the first organic film layer 400 is patterned, the first organic film layer 400 is reserved at the position where the connection bridge 120 is coupled to the island 110, so as to form the lapping region S. For example, as shown in FIG. 12, FIG. 17 and FIG. 24, the island 110 is coupled to the connection bridge 120 at four positions A, B, C and D, i.e., the island 110 has the lapping regions S at four positions A, B, C and D. The third pattern surrounds the display unit, and the second lapping patterns S2 are formed at the four positions A, B, C and D, so as to form the lapping regions S at the four positions A, B, C and D when the first organic film layer 400 is patterned.

In addition, in some other embodiments of the present disclosure, at the position where the connection bridge 120 is coupled to the island 110, the orthogonal projection of the third pattern onto the base substrate 100 does not coincide with the orthogonal projection of the lapping region S onto the base substrate 100. Based on the above, the third pattern is not provided with the second lapping pattern S2 coinciding with the lapping region S. In this regard, when the first organic film layer 400 is patterned, it is able for the pattern of the first organic film layer 400 to include the lapping region S through an additional mask.

In some embodiments of the present disclosure, as shown in FIG. 2, the display substrate further includes a packaging layer 50, and the packaging layer 50 covers a side of the display unit and a side of the connection unit away from the base substrate 100 in a shape-following manner.

In addition, in some embodiments of the present disclosure, as shown in FIG. 2, a polyimide (PI) layer 140 is arranged on the base substrate 100. The PI layer 140 is a protective film layer on the bottom of the base substrate, and it may be made of a material with high elasticity such as dimethyl siloxane, polyimide, and polyethylene glycol terephthalate (PET). An adhesive layer 150 (PSA) is arranged between the PI layer 140 and the base substrate 100, and it is made of an acrylic-based or silicon-based adhesive material. The PI layer 140 is arranged on the connection bridge 120 and the island 110 and etched off at the hollowed-out region 130, and the adhesive layer 150 covers the base substrate 100. On the island 110, the plurality of inorganic film layers 300 is arranged at a side of the PI layer 140 away from the base substrate 100. The plurality of inorganic film layers 300 includes an isolation layer 320, a buffer layer 330, a gate insulation layer 340 (GI, including a first gate insulation layer 341 and a second gate insulation layer 342) and an interlayer dielectric layer 310' (ILD). In the embodiments of the present disclosure, the interlayer dielectric layer 310' is the first inorganic film layer. On the connection bridge 120, the first organic film layer 400 is arranged at a side of the PI layer 140 away from the base substrate 100.

In addition, in some embodiments of the present disclosure, the display substrate further includes the packaging layer 50, and the packaging layer 50 covers the side of the display unit and the side of the connection unit away from the base substrate 100 in a shape-following manner.

The isolation layer 320, the buffer layer 330, the gate insulation layer 340 and the source/drain metal covering layer are all insulation layers made of a single or multiple inorganic layers such as SiOx, SiONx, or SiNx, or made of an inorganic semiconductor material (amorphous silicon and polysilicon), an organic semiconductor material, or an oxide-containing semiconductor material (such as oxides of metal elements in group 12, 13, and 14, such as Zn, In, and Ga).

The gate electrode, the source/drain metal pattern, and the first electrode 10 are all signal lines 200 or metal lines made of a conductive metal such as titanium (Ti), aluminium (Al), molybdenum (Mo) or argentum (Ag), or a conductive oxide such as indium tin oxide (ITO), indium zinc oxide (IZO), zinc oxide (ZnO), In2O3, IGO or AZO, or a conductive material with high ductility such as rubber mixed with conductive particles, or a carbon nanotube.

The first organic film layer 400 and the second organic film layer 500 are made of one or more of a common polymer of polymethyl methacrylate and polystyrene, a polymer derivative based on a phenol group, an acrylic-based polymer, a paraxylene-based polymer, an aryl ether-based polymer, an amide-based polymer, a fluoride-based polymer, or a vinyl alcohol-based polymer. The first organic film layer 400 and the second organic film layer 500 are arranged at a side of the signal line 200 close to the base substrate 100 and at a side of the signal line 200 away from the base substrate 100 respectively, so as to protect the signal line 200 from being broken. Both the first organic film layer 400 and the second organic film layer 500 are patterned through a photolithography process.

The pixel definition layer 40 is made of one or more of a common polymer of polymethyl methacrylate and polystyrene, a polymer derivative based on a phenol group, an acrylic-based polymer, a paraxylene-based polymer, an aryl ether-based polymer, an amide-based polymer, a fluoride-based polymer, or a vinyl alcohol-based polymer.

The first electrode 10 is a pixel anode, and the second electrode 20 is a pixel cathode.

The first electrode 10 is made of a conductive metal such as Ti, Al, Mo, or Ag, or a conductive oxide such as ITO, IZO, ZnO, In$_2$O$_3$, IGO, or AZO.

The light-emitting layer 30 is an organic light-emitting layer 30 made of a phosphorescent or fluorescent light-emitting material.

The second electrode 20 is made of a conductive metal such as Ti, Al, Mo, or Ag, or a metal alloy, or a conductive oxide such as ITO, IZO, ZnO, In$_2$O$_3$, IGO, or AZO.

The packaging layer 50 includes one or more inorganic layers, and it includes a single layer or multiple layers made of SiOx, SiONx or SiNx, or a dense film layer made of aluminum oxide, aluminum nitride, titanium nitride, or titanium nitride.

In addition, the present disclosure further provides in some embodiments a display device, including the above-mentioned display substrate.

In addition, the present disclosure further provides in some embodiments a method for manufacturing the above-mentioned display substrate, which includes the following steps.

Step S01: providing a base substrate 100. The base substrate 100 includes a hollowed-out region 130, a plurality of islands 110 arranged in an array form and separated from each other and a plurality of connection bridges 120 for coupling the islands 110 to each other.

The base substrate 100 is a flexible substrate, a PI layer 140 is applied on the base substrate 100, and an isolation layer 320, a buffer layer 330, a gate electrode pattern, a gate insulation layer 340 and an interlayer dielectric layer 310' are formed on the PI layer 140 in sequence. Then, the inorganic films such as the isolation layer 320, the buffer layer 330, the gate insulation layer 340 and the interlayer dielectric layer 310' on the hollowed-out region 130 and the connection bridge 120 are etched off, and the PI layer 140 on the hollowed-out region 130 and the connection bridge 120 is reserved.

S02: forming a plurality of display units and a connection unit through which the display units are electrically coupled to each other on the base substrate 100.

Each island 110 is provided with at least one of the display units, the connection unit includes the plurality of signal lines 200, one part of each signal line 200 is arranged on the connection bridge 120, and the other part of the signal line 200 extends to the island 110 and is electrically coupled to the display unit. The base substrate is provided with a source/drain metal pattern, and the source/drain metal pattern includes patterns of the plurality of signal lines 200. On the island 110, the plurality of inorganic film layers 300 is arranged between the base substrate 100 and the source/drain metal pattern, and the plurality of inorganic film layers 300 includes a first inorganic film layer 310 arranged at a side furthest away from the base substrate 100. On the connection bridge 120, at least one first organic film layer 400 is arranged between the base substrate 100 and the source/drain metal pattern, an orthogonal projection of the first organic film layer 400 onto the base substrate 100 coincides with an orthogonal projection of the connection bridge 120 onto the base substrate 100, and a surface of the first organic film layer 400 away from the base substrate 100 is flush with a surface of the first inorganic film layer 310 away from the base substrate 100, or a segment difference between the surface of the first organic film layer 400 away from the base substrate 100 and the surface of the first inorganic film layer 310 away from the base substrate 100 is less than a predetermined threshold.

For example, S02 specifically includes: depositing the plurality of inorganic film layers on the base substrate, removing the plurality of inorganic film layers on the connection bridge, and reserving the plurality of inorganic film layers on the island, and the plurality of inorganic film layers including the first inorganic film layer arranged at a side furthest away from the base substrate; forming a first organic material layer covering the entire base substrate at a side of the first inorganic film layer away from the base substrate; patterning the first organic material layer to form a first organic pattern, the first organic pattern including a first reserved region and a first aperture region, and the first aperture region at least including a region corresponding to the display unit; forming a source/drain metal layer at the side of the first inorganic film layer away from the base substrate; patterning the source/drain metal layer to form the source/drain metal pattern; and etching the first organic material layer corresponding to the hollowed-out region to form the first organic film layer.

In some embodiments of the present disclosure, the first reserved region includes a pattern of the lapping region.

The method will be described hereinafter in more details.

For example, S02 specifically includes the following steps.

S021: depositing the plurality of inorganic film layers 300 on the base substrate 100, removing the plurality of inorganic film layers 300 on the connection bridge 120, and reserving the plurality of inorganic film layers 300 on the island 110, the plurality of inorganic film layers 300 including the first inorganic film layer 310 arranged at a side furthest away from the base substrate.

S022: forming a first organic material layer 400' covering the entire base substrate 100 at a side of the first inorganic film layer 310 away from the base substrate 100, and patterning the first organic material layer 400' to form a first organic pattern, the first organic pattern including a first reserved region a and a first aperture region, and the first aperture region at least including a region corresponding to the display unit.

S023: forming a source/drain metal layer at a side of the first inorganic film layer 310 away from the base substrate 100, and patterning the source/drain metal layer to form the source/drain metal pattern.

S024: forming a second organic material layer at a side of the source/drain metal pattern away from the base substrate 100, and patterning the second organic material layer to form a second organic pattern, the second organic pattern including a second reserved region and a second aperture region.

S025: forming a source/drain metal covering layer 600' at a side of the second organic pattern away from the base substrate 100, and patterning the source/drain metal covering layer 600' to form a source/drain metal covering pattern 600. The source/drain metal covering pattern 600 includes a first pattern arranged on the island 110 and a second pattern arranged on the connection bridge 120. The first pattern covers the source/drain metal pattern, the second reserved region, and a side of the first organic material layer 400' away from the base substrate 100, and an orthogonal projection of the first pattern onto the base substrate 100 surrounds an orthogonal projection of the display unit onto the base substrate 100. The second pattern covers a side of the second organic film layer 500 away from the base substrate 100, and an orthogonal projection of the second pattern onto the base substrate 100 coincides with the orthogonal projection of the second organic film layer 500 onto the base substrate 100.

S026: forming a pixel definition layer 40 on the base substrate 100, the pixel definition layer 40 being provided with a plurality of pixel apertures.

S027: forming a pattern of a first electrode 10 of the light-emitting element on the base substrate 100.

S028: forming an electrode covering layer 700 at a side of the first electrode 10 away from the base substrate 100 in a shape-following manner, the pattern of the electrode covering layer 700 including a third pattern arranged on the island 110 and a fourth pattern arranged on the connection bridge 120, the third pattern at least including an aperture pattern coinciding with the pixel aperture, and an orthogonal projection of the fourth pattern onto the base substrate 100 coinciding with the orthogonal projection of the second pattern onto the base substrate 100.

S029: etching the organic material layer corresponding to the hollowed-out region 130, the organic material layer including a first organic material layer 400' and a second organic material layer. During the etching, the source/drain metal covering layer 600' and the electrode covering layer 700 serve as masks to shield the source/drain metal pattern and the pattern of the first electrode 10 respectively.

In some embodiments of the present disclosure, in the method, when the first reserved region a includes the pattern of the lapping region S (i.e., the region S' in FIG. 12 is a pattern corresponding to the lapping region S in the first reserved region a), the second reserved region includes a pattern of the lapping region S, the orthogonal projection of the first pattern onto the base substrate 100 includes the first lapping pattern S1 coinciding with the orthogonal projection of the lapping region S onto the base substrate 100, and the orthogonal projection of the third pattern onto the base substrate 100 includes the second lapping pattern S2 coinciding with the orthogonal projection of the lapping region S onto the base substrate 100.

Based on the above, when the first reserved region a and the second reserved region include the pattern of the lapping region S, it means that the pattern of the lapping region S is directly formed through the mask when the first organic film layer 400 and the second organic film layer 500 are patterned in S022 and S023. At this time, the first lapping pattern S1 and the second lapping pattern S2 are also formed on the source/drain metal covering layer 600' and the electrode covering layer 700 respectively.

In some other embodiments of the present disclosure, when the first reserved region a includes the pattern of the lapping region S, the second reserved region includes the pattern of the lapping region S, and the first pattern and the third pattern do not include the pattern of an lapping region S. When the first reserved region a and the second reserved region do not include the pattern of the lapping region S, it means that the pattern of the lapping region S is not formed when the first organic film layer 400 and the second organic film layer 500 are patterned in S022 and S023. At this time, the source/drain metal covering pattern 600 and the electrode covering pattern do not include the pattern of the overlap region S in S028 and S029.

In some other embodiments of the present disclosure, when the first reserved region a does not include the pattern of the lapping region S, the second reserved region does not include the pattern of the lapping region S, the orthogonal projection of the first pattern onto the base substrate 100 includes the first lapping pattern S1 coinciding with the orthogonal projection of the lapping region S onto the base substrate 100, and the orthogonal projection of the third pattern onto the base substrate 100 includes the second lapping pattern S2 coinciding with the orthogonal projection of the lapping region S onto the base substrate 100. Based on the above, when the first reserved region a and the second reserved region include the pattern of the lapping region S, it means that the pattern of the lapping region S is not formed through the mask in the case that the first organic film layer 400 and the second organic film layer 500 are patterned in S022 and S023. A this time, the first lapping pattern S1 and the second lapping pattern S2 are formed on the source/drain metal covering layer 600' and the electrode covering layer 700 respectively, so as to form the lapping region S.

The method will be described herein in more details hereinafter.

First Embodiment

The method includes the following steps.

Figure 4:
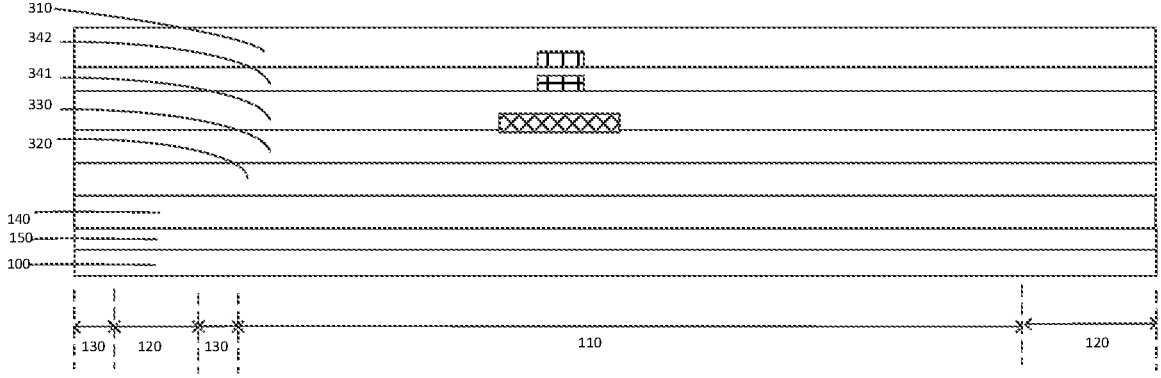
FIG. 4 is a schematic view showing a situation where a polyimide (PI) layer is applied on a base substrate and an inorganic film layer is deposited on the base station in S01 according to one embodiment of the present disclosure.
Figure 5:
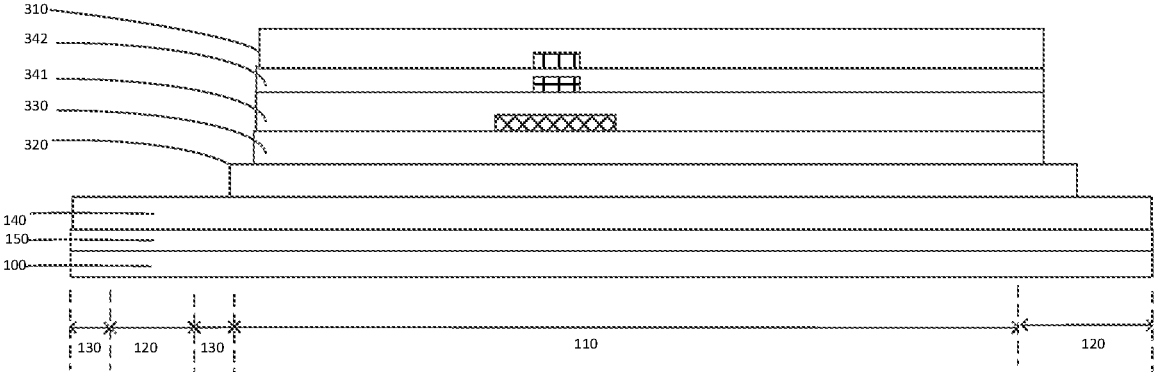
FIG. 5 is a schematic view showing a situation where the inorganic film layer on the connection bridge is removed in S021 according to one embodiment of the present disclosure.

S01: as shown in FIG. 4 and FIG. 5, a base substrate 100, e.g., a flexible substrate, is provided, a PI layer 140 is applied on the base substrate 100, and an isolation layer 320, a buffer layer 330, a gate electrode pattern, a gate insulation layer 340 and an interlayer dielectric layer 310' on the PI layer 140 are formed in sequence (as shown in FIG. 3). As shown in FIG. 4, the interlayer dielectric layer 310' is the first inorganic film layer 310. Next, the inorganic films such as the isolation layer 320, the buffer layer 330, the gate insulation layer 340 and the interlayer dielectric layer 310' on the hollowed-out region 130 and the connection bridge 120 are etched off, the PI layer 140 on the hollowed-out region 130 and the connection bridge 120 is reserved, and the isolation layer 320, the buffer layer 330, the gate insulation layer 340 and the interlayer dielectric layer 310' on the island 110 are reserved (as shown in FIG. 5).

Figure 6:
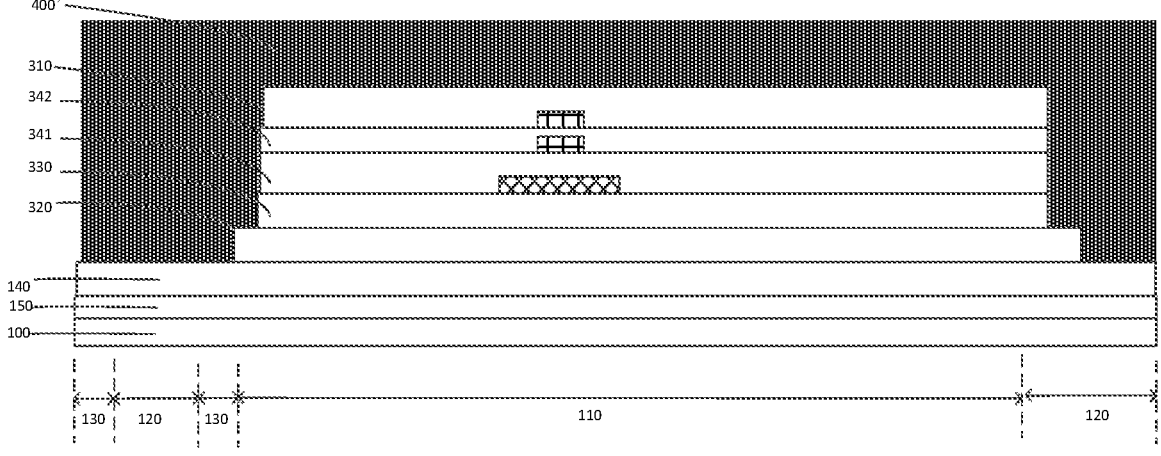
FIG. 6 is a schematic view showing a situation where a first organic material layer is applied on the entire base substrate in S021 according to one embodiment of the present disclosure.
Figure 7:
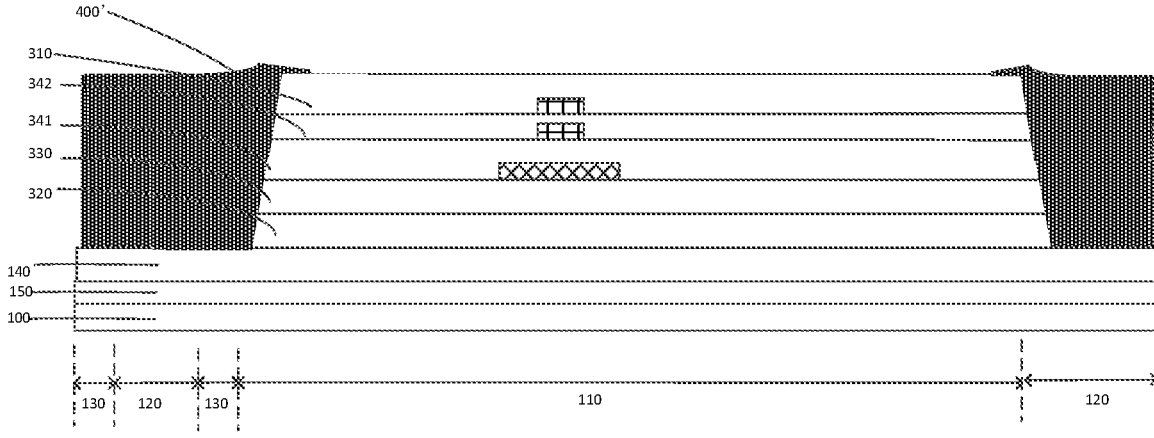
FIG. 7 is a schematic view showing a situation where the first organic material layer is patterned in S021 according to one embodiment of the present disclosure.
Figure 8:
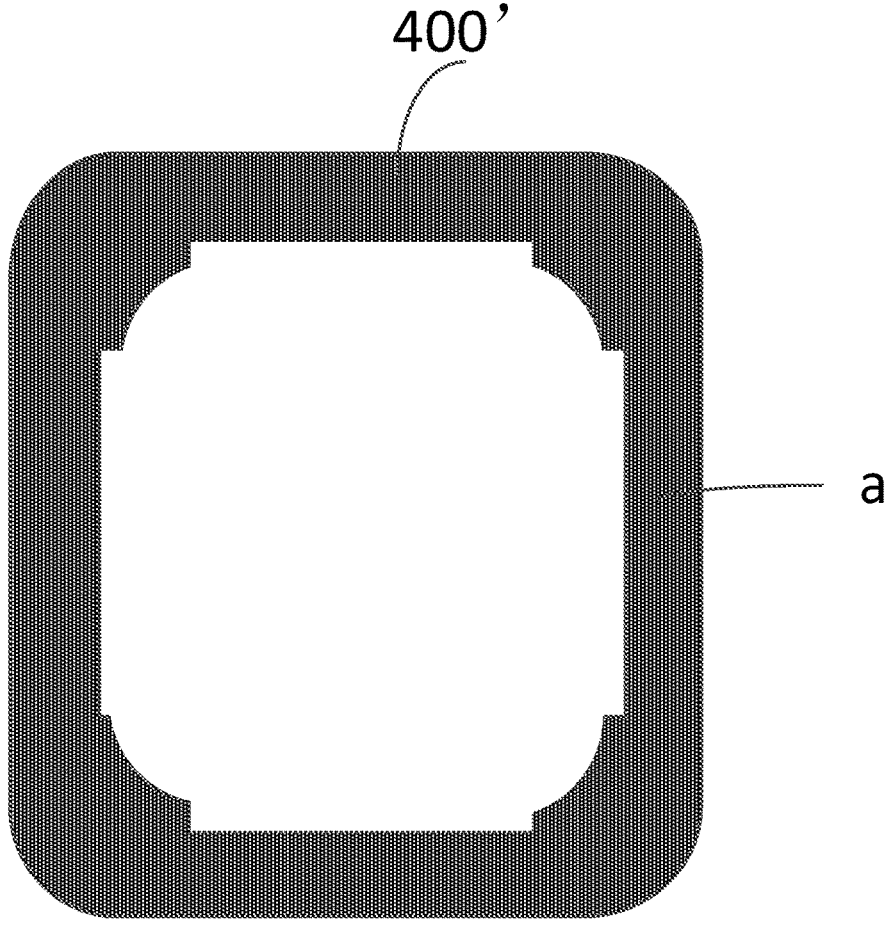
FIG. 8 is a top view of the first organic material layer in FIG. 7.

S021: a first organic material layer 400' covering the entire base substrate 100 is formed at a side of the first inorganic film layer 310 away from the base substrate 100. The first organic material layer 400' is applied on the entire base substrate so as to fill a step between the plurality of inorganic film layers 300 on the island 110 and the connection bridge 120 as well as the hollowed-out region 130 (as shown in FIG. 6). Next, the first organic material layer 400' is patterned to form a first organic pattern, and the first organic pattern includes a first reserved region a and a first aperture region (as shown in FIG. 7 and FIG. 8). As shown in FIG. 8, the first reserved region a includes the pattern of the lapping region S.

Figure 9:
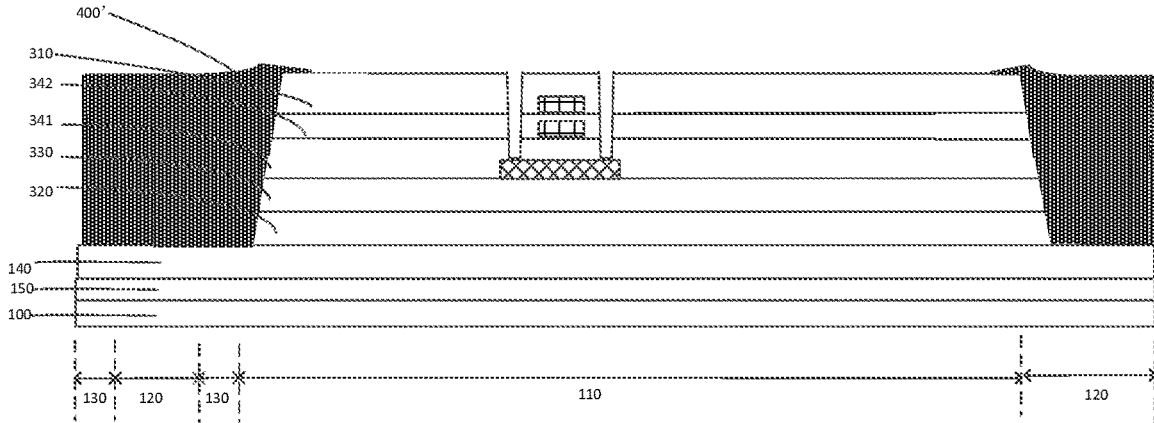
FIG. 9 is a schematic view showing S022 according to one embodiment of the present disclosure.

S022: as shown in FIG. 9, an aperture is formed in the interlayer dielectric layer 310' to expose an active layer.

Figure 10:
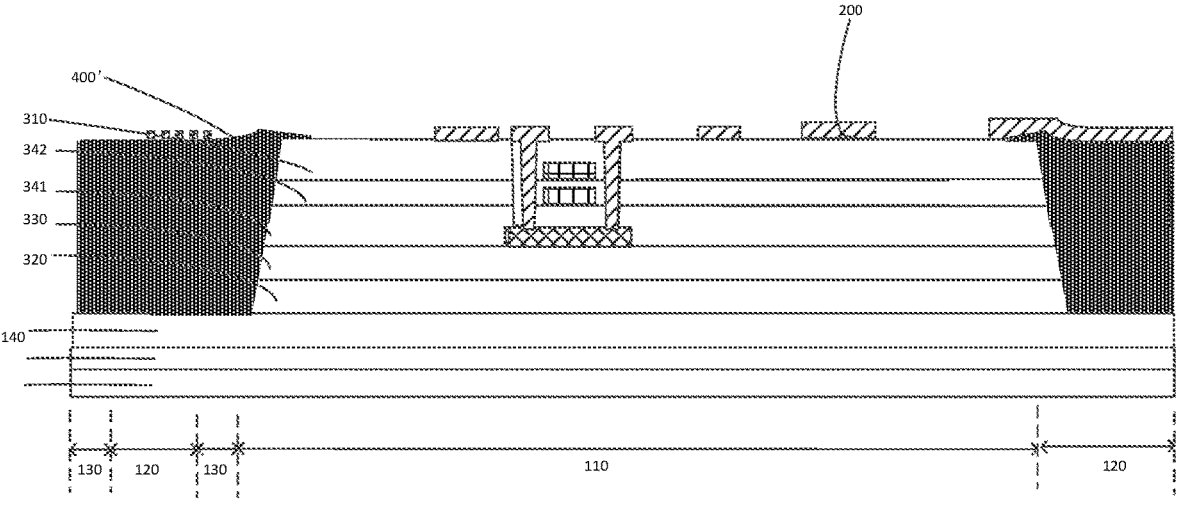
FIG. 10 is a schematic view showing S023 o according to one embodiment of the present disclosure.

S023: as shown in FIG. 10, a source/drain metal layer is deposited on the interlayer dielectric layer 310', and then is patterned to form the source/drain metal pattern.

Figure 11:
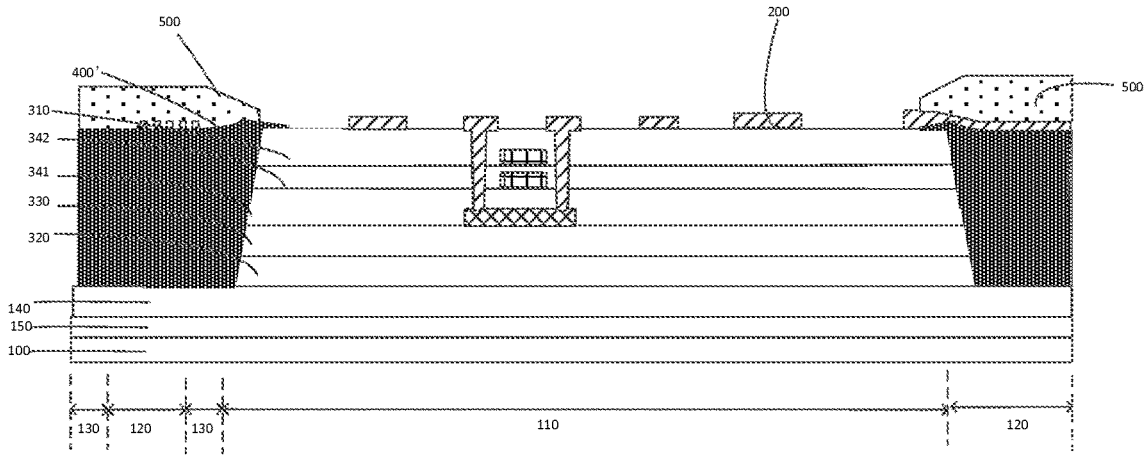
FIG. 11 is a schematic view showing S024 according to one embodiment of the present disclosure.

S024: as shown in FIG. 11 and FIG. 12, a second organic material layer is formed at a side of the source/drain metal pattern away from the base substrate 100, and patterned to form a second organic pattern. The second organic pattern includes a second reserved region and a second aperture region, and the second reserved region includes a pattern of the lapping region S.

Figure 13:
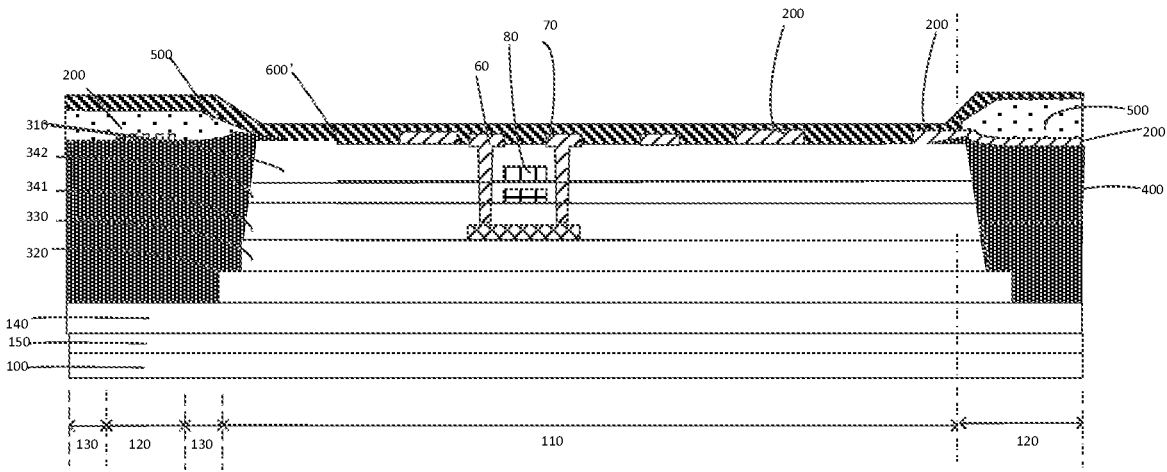
FIG. 13 is a schematic view showing S024 according to one embodiment of the present disclosure.
Figure 14:
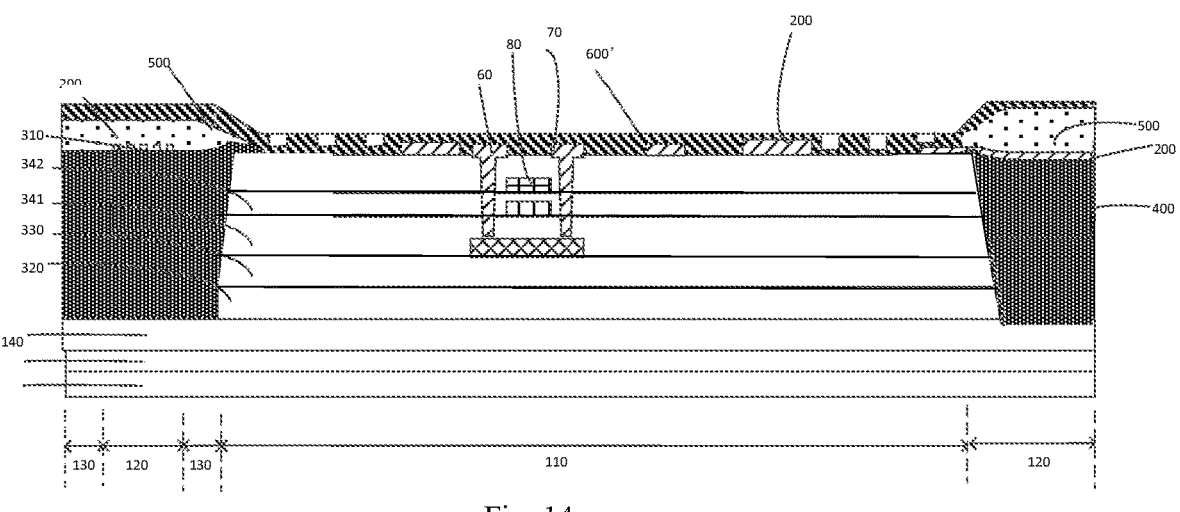
FIG. 14 is a schematic view showing S026 according to one embodiment of the present disclosure.

S0251: as shown in FIG. 13, a source/drain metal covering layer 600' is formed at a side of the second organic pattern away from the base substrate 100. As shown in FIG. 14 and FIG. 15, the source/drain metal covering layer 600' is patterned to form a source/drain metal covering pattern 600, and the source/drain metal covering pattern 600 includes at least one groove 620 surrounding the display unit.

S0252: as shown in FIG. 16 and FIG. 17, the source/drain metal covering layer 600' corresponding to the display unit and the source/drain metal covering layer 600' corresponding to the hollowed-out region 130 are etched to form the source/drain metal covering pattern 600. The source/drain metal covering pattern 600 includes a first pattern arranged on the island 110 and a second pattern arranged on the connection bridge 120, an orthogonal projection of the first pattern onto the base substrate 100 surrounds an orthogonal projection of the display unit onto the base substrate 100, the first pattern does not includes the first lapping pattern S1 corresponding to the lapping region S, and an orthogonal projection of the second pattern onto the base substrate 100 coincides with the orthogonal projection of the second organic film layer 500 onto the base substrate 100.

S026: a pixel definition layer 40 is formed on the base substrate 100, and the pixel definition layer 40 is provided with a plurality of pixel apertures.

Figure 18:
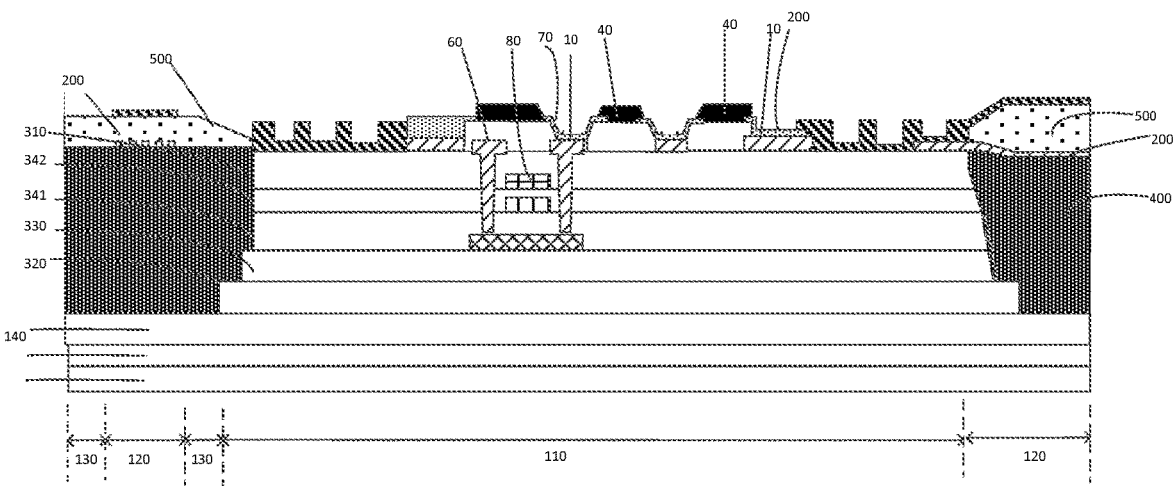
FIG. 18 is a schematic view showing S028 according to one embodiment of the present disclosure.

S027: a pattern of a first electrode 10 of the light-emitting element is formed on the base substrate 100 (as shown in FIG. 18).

Figure 19:
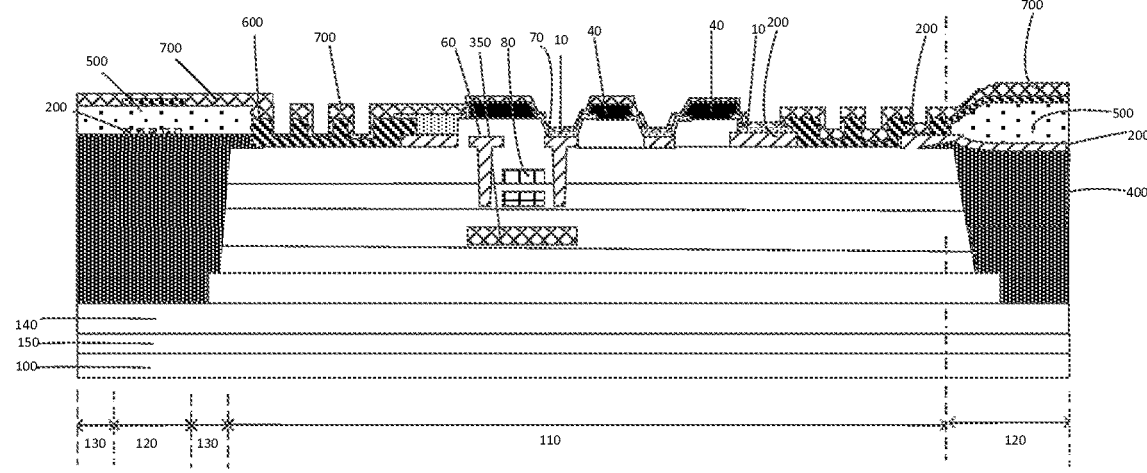
FIG. 19 is a schematic view showing S028 according to one embodiment of the present disclosure.

S0281: as shown in FIG. 19, an electrode covering layer 700 covers a side of the first electrode 10 away from the base substrate 100 in a shape-following manner.

Figure 20:
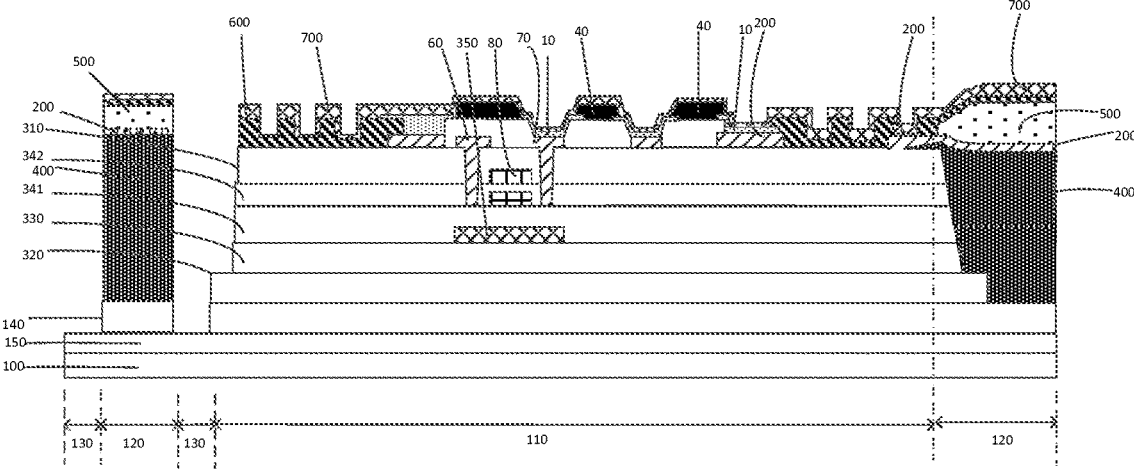
FIG. 20 is a schematic view showing S028 according to one embodiment of the present disclosure.
Figure 21:
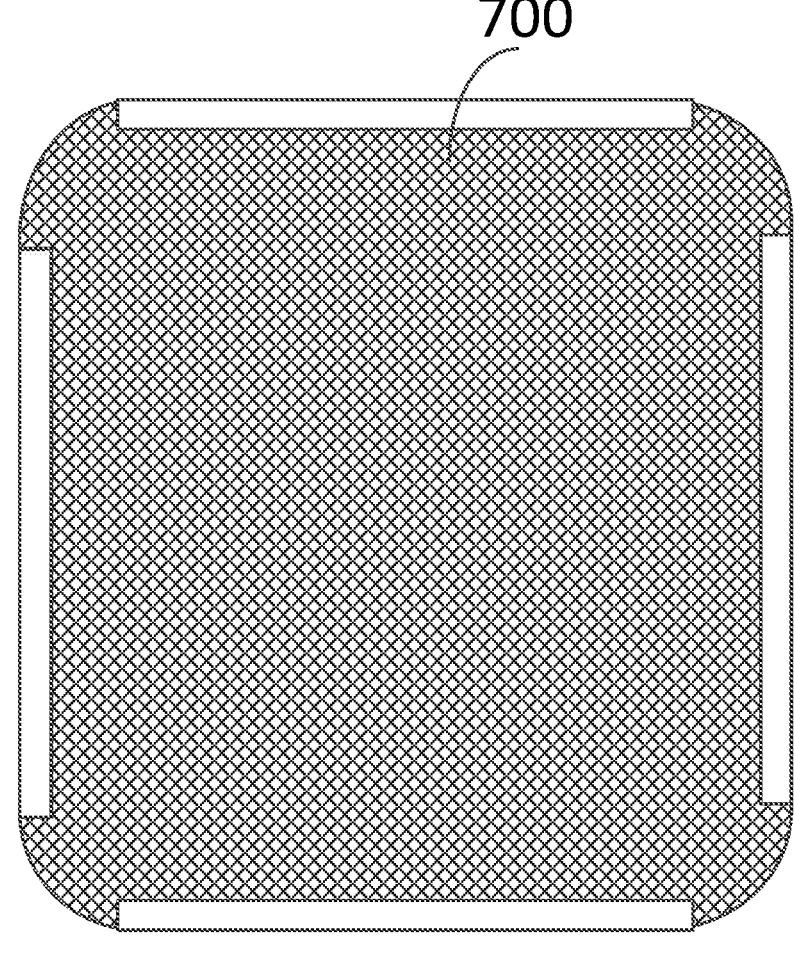
FIG. 21 is a top view of the display substrate in FIG. 20.

S0282: as shown in FIG. 20 and FIG. 21, the electrode covering layer 700, the first organic film layer 400, the second organic film layer 500 and the PI layer 140 in the regions corresponding to the hollowed-out region 130 are etched off.

Figure 22:
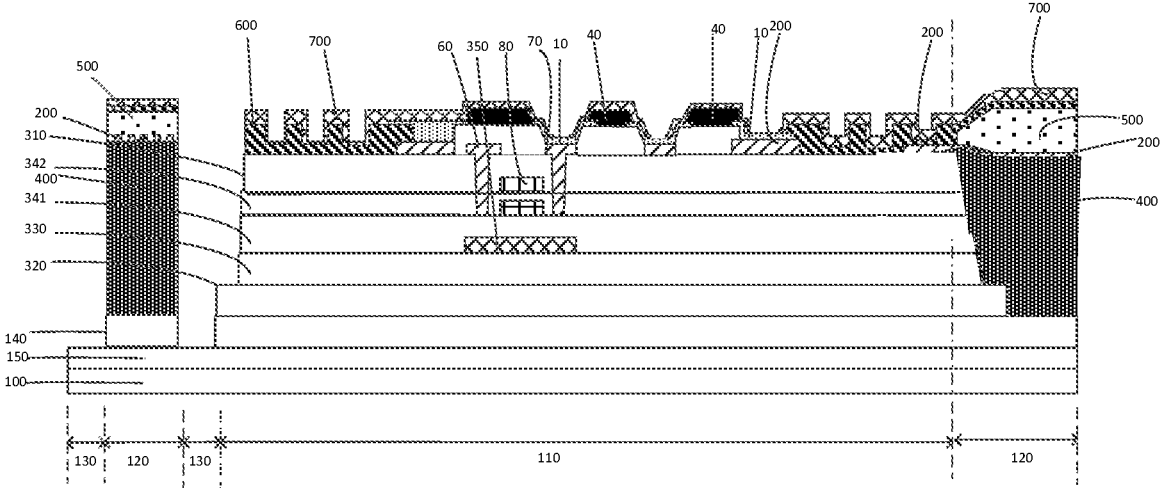
FIG. 22 is a schematic view showing S028 according to one embodiment of the present disclosure.

S029: as shown in FIG. 22 and FIG. 23, the electrode covering layer 700 in the region corresponding to the first electrode 10 is etched off so that the pattern of the electrode covering layer 700 includes a third pattern arranged on the island 110 and a fourth pattern arranged on the connection bridge 120. The third pattern at least includes an aperture pattern coinciding with the pixel aperture, and an orthogonal projection of the fourth pattern onto the base substrate 100 coincides with the orthogonal projection of the second pattern onto the base substrate 100. The third pattern does not include a pattern corresponding to the lapping region S.

S030: forming a light-emitting layer 30 through evaporation.

S031: packaging the base substrate 100 to form a packaging layer 50.

Second Embodiment

A difference between the second embodiment and the first embodiment is that, in S0252, the first pattern includes the first lapping pattern S1 corresponding to the lapping region S, and in S029, the third pattern includes a pattern corresponding to the lapping region S.

Third Embodiment

A difference between the third embodiment and the first embodiment is that, in S021, the first reserved region a does not include the pattern of the lapping region S, in step S024, the second reserved region includes the pattern of the lapping region S, in step S0252, the first pattern includes the first lapping pattern S1 corresponding to the lapping region S, and in step S029, the third pattern includes a pattern corresponding to the lapping region S.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
a base substrate, comprising a hollowed-out region, a plurality of islands arranged in an array form and separated from each other and a connection bridge for coupling the islands to each other;
a plurality of display units arranged in an array form, each island being provided with at least one of the display units; and
a connection unit through which the display units are electrically coupled to each other, the connection unit comprising a plurality of signal lines, a part of each signal line being arranged on the connection bridge, and the other part of the signal line extending to the island to be electrically coupled to the display unit,
wherein a source/drain metal pattern is arranged on the base substrate and comprises patterns of the plurality of signal lines;
on the island, a plurality of inorganic film layers is arranged between the base substrate and the source/drain metal pattern, and the plurality of inorganic film layers comprises a first inorganic film layer arranged at a side furthest away from the base substrate; and
on the connection bridge, at least one first organic film layer is arranged between the base substrate and the source/drain metal pattern, an orthogonal projection of the first organic film layer onto the base substrate coincides with an orthogonal projection of the connection bridge onto the base substrate, an orthogonal projection of a part of the first organic film layer onto the base substrate partially overlaps with an orthogonal projection of the island onto the base substrate to form an lapping region at a position where the connection bridge is coupled to the island, and a surface of the first organic film layer away from the base substrate is flush with a surface of the first inorganic film layer away from the base substrate, or a segment difference between the surface of the first organic film layer away from the base substrate and the surface of the first inorganic film layer away from the base substrate is less than a predetermined threshold.

2. The display substrate according to claim 1, wherein the orthogonal projection of the first organic film layer onto the base substrate does not coincide with an orthogonal projection of the hollowed-out region onto the base substrate, and the orthogonal projection of the first organic film layer onto the base substrate does not coincide with the orthogonal projection of the island onto the base substrate at a position where the connection bridge is not coupled to the island,
  wherein the lapping region covers a side surface of the first inorganic film layer away from the base substrate, wherein a width d of the lapping region is greater than 0 and less than or equal to 2 µm.

3. The display substrate according to claim 2, wherein the lapping region is inclined from the connection bridge to the island.

4. The display substrate according to claim 3, wherein the orthogonal projection of the lapping region onto the base substrate is of an arc-like or right-angled shape.

5. The display substrate according to claim 2, wherein a pattern of the orthogonal projection of the island onto the base substrate comprises a first boundary line at the position where the connection bridge is coupled to the island, and an orthogonal projection of the lapping region onto the base substrate extends along the first boundary line.

6. The display substrate according to claim 1, wherein the connection bridge is further provided with a second organic film layer arranged at a side of the source/drain metal pattern away from the base substrate, and an orthogonal projection of the second organic film layer onto the base substrate coincides with the orthogonal projection of the first organic film layer onto the base substrate.

7. The display substrate according to claim 6, wherein the base substrate is further provided with a source/drain metal covering pattern, and the source/drain metal covering pattern comprises a first pattern arranged on the island and a second pattern arranged on the connection bridge;
  the first pattern covers a side of the source/drain metal pattern away from the base substrate, and an orthogonal projection of the first pattern onto the base substrate surrounds an orthogonal projection of the display unit onto the base substrate; and
  the second pattern covers a side of the second organic film layer away from the base substrate, and an orthogonal projection of the second pattern onto the base substrate coincides with the orthogonal projection of the second organic film layer onto the base substrate.

8. The display substrate according to claim 7, wherein at the position where the connection bridge is coupled to the island, the orthogonal projection of the first pattern onto the base substrate comprises a first lapping pattern, and the first lapping pattern coincides with the orthogonal projection of the lapping region onto the base substrate, or the orthogonal projection of the first pattern onto the base substrate does not coincide with the orthogonal projection of the lapping region onto the base substrate.

9. The display substrate according to claim 7, wherein the first pattern is provided with at least one groove surrounding the display unit at a side away from the base substrate.

10. The display substrate according to claim 7, wherein the display unit comprises a first electrode, a second electrode arranged at a side of the first electrode away from the base substrate and a light-emitting layer arranged between the first electrode and the second electrode, the base substrate is further provided with a pixel definition layer for defining a plurality of pixel apertures, and the first electrode and the light-emitting layer are arranged in the pixel apertures,
  wherein the base substrate is further provided with an electrode covering layer arranged between the first electrode and the second electrode, an pattern of the electrode covering layer comprises a third pattern arranged on the island and a fourth pattern arranged on the connection bridge, the third pattern at least comprises an aperture pattern coinciding with the pixel aperture, and an orthogonal projection of the fourth pattern onto the base substrate coincides with the orthogonal projection of the second pattern onto the base substrate.

11. The display substrate according to claim 10, wherein at the position where the connection bridge is coupled to the island, an orthogonal projection of the third pattern onto the base substrate comprises a second lapping pattern, and the second lapping pattern completely coincides with the orthogonal projection of the lapping region onto the base substrate; or
  at the position where the connection bridge is coupled to the island, the orthogonal projection of the third pattern onto the base substrate does not coincide with the orthogonal projection of the lapping region onto the base substrate.

12. The display substrate according to claim 1, further comprising a packaging layer, wherein the packaging layer covers a side of the display unit and a side of the connection unit away from the base substrate in a shape-following manner.

13. The display substrate according to claim 1, wherein the plurality of inorganic film layers comprises an isolation layer, a buffer layer, a gate insulation layer and an interlayer dielectric layer arranged sequentially from a side close to the base substrate to a side away from the base substrate, and the first inorganic film layer is the interlayer dielectric layer.

14. A display device, comprising the display substrate according to claim 1.

15. A method for manufacturing the display substrate according to claim 1, comprising:
  providing the base substrate, the base substrate comprising the hollowed-out region, the plurality of islands arranged in the array form and separated from each other and the connection bridge for coupling the islands to each other; and
  forming the plurality of display units and the connection unit through which the display units are electrically coupled to each other on the base substrate, each island being provided with at least one of the display units, the connection unit comprising the plurality of signal lines, the part of each signal line being arranged on the connection bridge, and the other part of the signal line extending to the island to be electrically coupled to the display unit,
  wherein the source/drain metal pattern is arranged on the base substrate and comprises the patterns of the plurality of signal lines;
  on the island, the plurality of inorganic film layers is arranged between the base substrate and the source/drain metal pattern, and the plurality of inorganic film layers comprises the first inorganic film layer arranged at the side furthest away from the base substrate; and
  on the connection bridge, at least one first organic film layer is arranged between the base substrate and the source/drain metal pattern, the orthogonal projection of the first organic film layer onto the base substrate coincides with the orthogonal projection of the connection bridge onto the base substrate, the orthogonal projection of the part of the first organic film layer onto the base substrate partially overlaps with the orthogonal projection of the island onto the base substrate to form the lapping region at the position where the connection bridge is coupled to the island, and the surface of the first organic film layer away from the base substrate is flush with the surface of the first inorganic film layer away from the base substrate, or the segment difference between the surface of the first organic film layer away from the base substrate and the surface of the first inorganic film layer away from the base substrate is less than a predetermined threshold.

16. The method according to claim 15, wherein the forming the plurality of display units and the connection unit through which the display units are electrically coupled to each other on the base substrate comprises: depositing the plurality of inorganic film layers on the base substrate, removing the plurality of inorganic film layers on the connection bridge, and reserving the plurality of inorganic film layers on the islands, wherein the plurality of inorganic film layers comprises the first inorganic film layer arranged at a side furthest away from the base substrate.

17. The method according to claim 16, wherein subsequent to depositing the plurality of inorganic film layers on the base substrate, removing the plurality of inorganic film layers on the connection bridge and reserving the plurality of inorganic film layers on the islands, the method further comprises:

forming a first organic material layer covering the entire base substrate at a side of the first inorganic film layer away from the base substrate; and patterning the first organic material layer to form a first organic pattern, the first organic pattern comprising a first reserved region and a first aperture region, and the first aperture region at least comprising a region corresponding to each display unit.

18. The method according to claim 17, wherein subsequent to patterning the first organic material layer to form the first organic pattern, the method further comprises:

forming a source/drain metal layer at a side of the first inorganic film layer away from the base substrate; and patterning the source/drain metal layer to form the source/drain metal pattern.

19. The method according to claim 17, wherein the first reserved region comprises a pattern of the lapping region.

20. The method according to claim 18, wherein subsequent to patterning the source/drain metal layer to form the source/drain metal pattern, the method further comprises etching the first organic material layer corresponding to the hollowed-out region to form the first organic film layer.

* * * * *